United States Patent

Mancini

[15] 3,654,583

[45] Apr. 4, 1972

[54] CIRCUIT BOARD EYELET

[72] Inventor: Lloyd Mancini, New Cumberland, Pa.

[73] Assignee: Berg Electronics, Inc., New Cumberland, Pa.

[22] Filed: June 22, 1970

[21] Appl. No.: 48,302

[52] U.S. Cl...........................339/17 C, 174/68.5, 339/95 D, 339/258 R, 339/275 B

[51] Int. Cl.....................H01r 9/06, H01r 11/22, H05k 1/02

[58] Field of Search......................339/17, 119, 95, 125, 127, 339/131, 256, 220, 258, 275; 248/56; 24/73, 259 R, 259 RC, 255.2, 255 R, 255 AS, 243 R, 243.8; 174/68.5; 317/101 R, 101 A, 101 C, 101 CC, 101 B

[56] References Cited

UNITED STATES PATENTS

| | | | |
|---|---|---|---|
| 3,504,328 | 3/1970 | Olsson | 339/275 B X |
| 2,407,998 | 9/1946 | Richardson | 339/145 |
| 3,334,395 | 8/1967 | Cook et al. | 174/68.5 X |
| 2,747,167 | 5/1956 | Parrish | 339/220 X |
| 3,288,915 | 11/1966 | Hatfield et al. | 339/276 R X |

*Primary Examiner*—Marvin A. Champion
*Assistant Examiner*—Terrell P. Lewis
*Attorney*—Thomas Hooker

[57] ABSTRACT

A circuit board solder eyelet having a flange with a flat annular printed circuit contact surface at one end of the eyelet for establishing a flush heat transmitting contact with a printed circuit pad on the board. The body portion of the eyelet may be provided with a cylindrical insulating sheath.

16 Claims, 4 Drawing Figures

INVENTOR
Lloyd Mancini
BY
Thomas Hooker,
His Attorney

PATENTED APR 4 1972 3,654,583

INVENTOR
Lloyd Mancini
BY
Thomas Hooker,
His Attorney

CIRCUIT BOARD EYELET

The invention relates to an improved solder type circuit board eyelet which is secured in a hole formed through the thickness of a circuit board. The eyelet includes a cylindrical body portion and an annular funnel flange on each end of the body. Flat pad contact surfaces are formed in the flanges so that when the eyelet is staked to the circuit board the surfaces lie flush against printed circuit pads on the circuit board. A cylindrical insulating sheath may be fitted around the eyelet body in order to insulate the eyelet from a metal core in the circuit board.

During wave soldering the flush contact between the eyelet flange and the printed circuit pad away from the solder bath assure that the pad is heated to a high temperature and that a reliable solder connection is formed between it and the adjacent flange. Solder flow notches are formed in the flange to facilitate the flow of solder from the interior of the eyelet into the annular solder vee defined by the pad and the flange.

In the disclosed eyelet a plastic insulating sheath is fitted around the cylindrical eyelet body and is confined between inner portions of two flat contact surfaces formed on the opposing eyelet flanges. When the eyelet is secured to a circuit board these surfaces engage the sides of the circuit board so that during soldering the heating plastic sheath material does not flow into the solder contact area between the flanges and printed circuitry on the board.

Additionally, solder flow notches are formed in the flange away from the solder bath. These notches extend from the edge of the flange into the flat flange portion and into the flat contact surface so as to expose the printed circuit pad and facilitate flow of molten solder up through the eyelet body and into the solder vee between the body and the flange.

Conventional circuit board eyelets, as disclosed in U.S. Pat. Nos. 2,915,678, 3,103,547, 3,190,953 and 3,504,328, are provided with flanges which have low area contacts with printed circuitry on the circuit board on which eyelets are staked. In these eyelets the connection between the flanges and pads occurs immediately adjacent the end of the circuit board hole where the flange is bent away from the eyelet body. In order to achieve reliable solder connections between conventional circuit board eyelets and printed circuitry on the side of the board away from the solder bath, the soldering parameters must be controlled narrowly. By the use of a circuit board eyelet as disclosed herein it is possible to achieve a greater flexibility in soldering conditions without sacrificing the reliability of the solder connections.

Other objects and features of the invention will become apparent as the description proceeds, especially when taken in conjunction with the accompanying drawings illustrating the invention of which there are two sheets.

IN THE DRAWINGS

Figure 1:
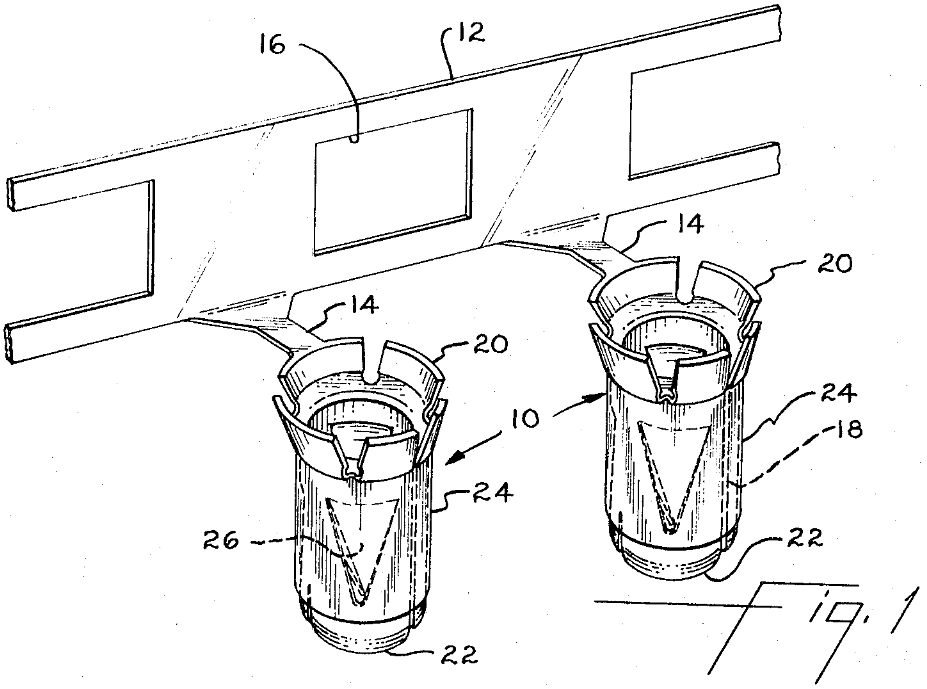
FIG. 1 is a perspective view of a strip of eyelets according to the invention.

FIG. 1 illustrates a strip of solder type circuit board eyelets. Each eyelet 10 is connected to a carrier strip 12 by a severable strip portion 14. The strip 12 is provided with pilot holes 16 to facilitate feeding of the strip in an applicator.

Figure 2:
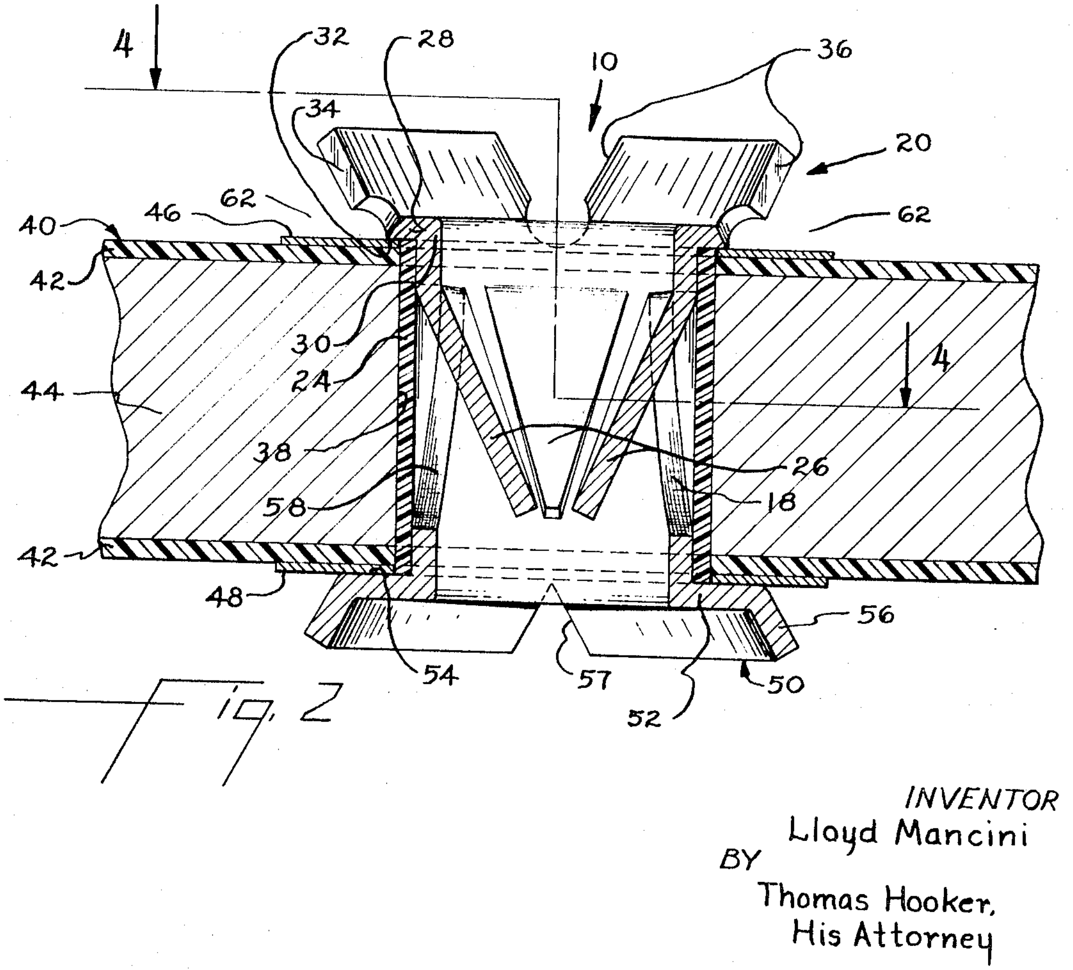
FIG. 2 is a sectional view taken through the thickness of a circuit board illustrating an eyelet staked to the circuit board.

Eyelets 10 are formed from strip stock and include a cylindrical body 18 having an annular flange 20 at one end thereof and a somewhat rounded annular portion 22 at the other end thereof. A cylindrical insulating sheath 24 is fitted around eyelet body portion 18 and extends between flange 20 and portion 22. Sheath 14 may be formed of a plastic material having a high melting temperature such as Teflon or Kapton, which are marketed by the E.I. du Pont Company of Wilmington, Delaware. After the eyelet is positioned in a circuit board hole, portion 22 is deformed to form a second flange cooperable with flange 20 to retain the eyelet in the circuit board hole. Wire grip fingers 26, as disclosed in U.S. Pat. No. 3,504,328, may be cut out of the side walls of body 18. As illustrated in FIG. 2, the fingers extend into the interior of the eyelet in order to retain leads inserted into the eyelet prior to soldering.

The flange 20 includes a flat annular portion 28 which extends outwardly from end 30 of body 18 with the outer surface 32 thereof lying in a plane perpendicular to the axis of the body 18. Surface 32 extends radially outwardly of the body past the sheath 24. Generally conical or funnel shaped flange portion 34 joins flat flange portion 28 outwardly of body 18 and extends around the eyelet. A number of solder flow notches 36 extend from the outer edge of flange portion 34 into flange portion 28 and surface 32.

Eyelets 10 are secured in holes formed through the thickness of a circuit board 40 or similar substrate. Circuit board 40 includes a pair of insulating sides 42 which surround a metal heat sink core 44, preferably formed of aluminum. Each end of hole 38 is surrounded by a thin printed circuit contact pad 46, 48. The diameter of hole 38 is slightly larger than the outside diameter of sheath 24 so that the eyelet is easily seated in the hole. The eyelet 10 may be used on multilayer substrates having an inner conductive circuit layer or even on conventional substrates without any internal metal or circuitry. In the latter case, the sheath 24 is not needed.

The eyelet staking operation may be performed by an automatic staking apparatus which severs eyelet 10 from strip 12 at portion 14 and positions the eyelet in the hole 38 with surface 32 resting flush upon printed circuit pad 46. Eyelet end 22 extends from the end of the hole at pad 48. The eyelet is then physically secured to the circuit board by deforming end 22 into the flange 50 similar to flange 20. The flange 50 includes a flat portion 52 defining a contact surface 54 and an annular generally conical or funnel shaped portion 56, which correspond to portion 28, surface 32 and portion 34 of flange 20 respectively. Notches 57 are formed in flange 50.

With the eyelet staked to the circuit board as illustrated in FIG. 2, surfaces 32 and 54 rest flush upon the circuit board pads 46 and 48. The ends of the cylindrical sheath 24 preferably abut surfaces 32 and 54 so that the sheath insulates core 44 from the eyelet and pads 46 and 48. Cut out portions 58 formed in body 18 expose the interior surface of the sheath. The notches 36 formed in flange 20 do not extend into flange portions 28 far enough to expose sheath 24.

Figure 3:
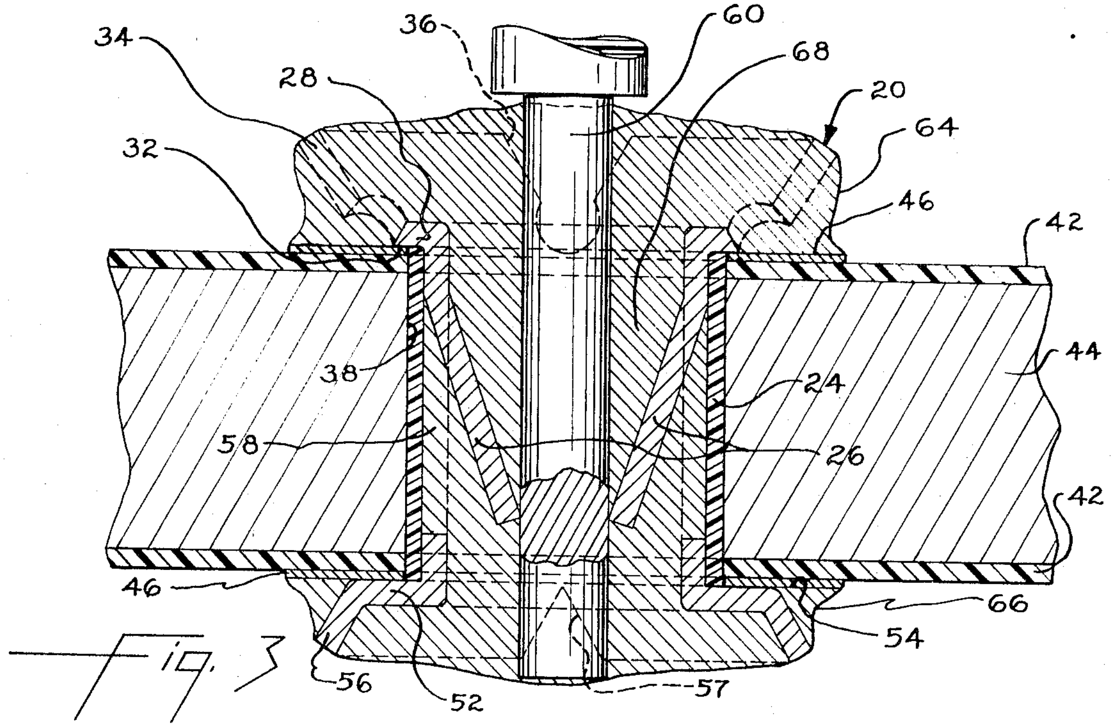
FIG. 3 is a sectional view similar to FIG. 2 showing the eyelet after insertion of a lead and soldering.
Figure 4:
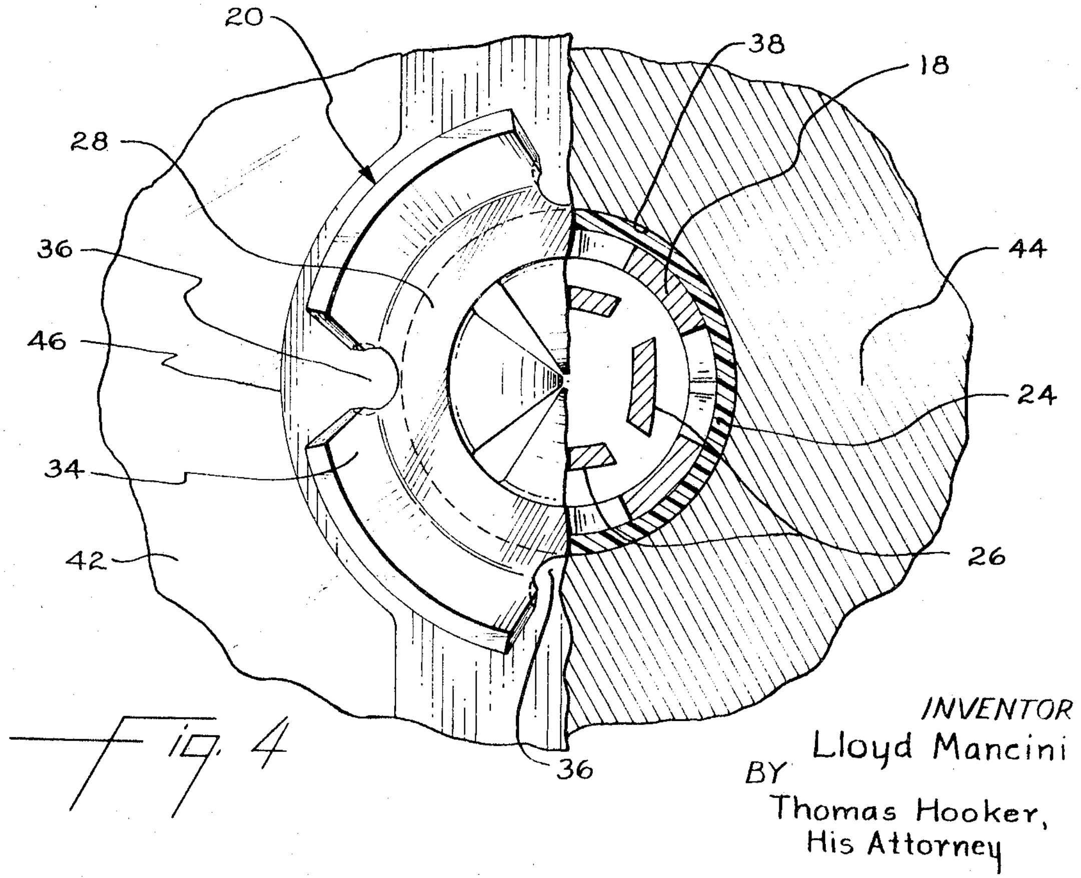
FIG. 4 is a view taken along line 4—4 of FIG. 2.

Following staking of the eyelet 10 to the circuit board, a lead 60 may be inserted into the eyelet so that the fingers 26 resiliently hold the lead in place prior to soldering. Side 61 of circuit board 40 is fluxed and then wave soldered to form a solder connection as illustrated in FIG. 3. During soldering the high temperature molten solder heats the eyelet 10. Heat flows from the solder bath through the eyelet body 18, flange portion 28 and the flush surface to surface contact between surface 32 and pad 46 to rapidly heat the pad. Molten solder from the wave is drawn by capillary action up through the interior of the body 18 so that it flows through the notches 36 and into the annular vee 62 defined by pad 46 and flange portion 34. At the time when the molten solder flows into vee 62, the pad 46 and flange portion 34 have been heated to a high temperature so that reliable electrical connections are formed between the solder and the printed circuit pad and the flange portion. The solder in vee 62 forms an annular fillet 64. During soldering an annular solder fillet 66 is also formed between printed circuit pad 48 and the conical flange portion 56. The lead 60 is soldered to the mass of solder 68 in the eyelet body 18. A reliable solder connection is formed between the lead 60 and both pads 46 and 48.

During soldering the insulating sheath 24 electrically insulates the aluminum core 44 so as to prevent a solder connection from being formed between the core and the eyelet. When the eyelet is staked to the circuit board, the flange surfaces 32 and 54 are seated in flush engagement with printed circuit pads 46 and 48. This connection assures that during soldering the heated material forming sheath 24 does not flow into the solder vees at either end of the eyelet. While the high temperature to which the eyelet is heated during soldering tends to soften sheath 24 its insulating properties are not affected.

The relative large area of contact between surface 32 and printed circuit pad 46 assures that the pad is rapidly heated to a soldering temperature and that a reliable solder connection is formed in mass production. While it is possible to achieve a reliable solder connection between a circuit board pad and a conventional eyelet flange on the side of the circuit board away from the solder wave, the low contact area between the conventional flange and the printed circuit pad requires that the soldering conditions be tightly controlled. The temperature of the solder bath, the method of application of flux to the bottom of the circuit board and the speed at which the board is passed over the solder wave all must be controlled within relatively narrow limits. Use of an eyelet 10 having a flush, large contact area connection between the eyelet flange and the printed circuit pad on the side away from the solder bath permits high speed production wave soldering in which the soldering parameters may be varied within greater tolerances than permitted with a conventional eyelet. This increased flexibility is of great advantage, particularly in mass production wave soldering.

FIG. 3 of the drawings illustrates that the eyelet 10 may be used to form a reliable electrical solder connection between lead 60 and printed circuit pads 46 and 48 on both sides of circuit board 44. Obviously, the eyelet may be used to form an interfacial connection between pads on both sides of the circuit board in which case a lead need not be inserted into the eyelet. The eyelet may also be used to form a connection between a lead and printed circuitry on only one side of a circuit board.

The term "circuit board" is intended to include other circuit substrates, including flexible panels. Likewise, "core" as used herein includes heat sink cores and also the inner conductive layers of multi-layer circuit boards. In circuit boards not having a metal heat sink core or metal conductive layer formed in the thickness thereof, it is not necessary to provide an insulating sheath 24 on the eyelet.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. An eyelet adapted to be fitted in a circuit board hole and soldered to the circuit board comprising a cylindrical body, a circumferential funnel flange at one end of the body, a flange or means for forming a flange at the other end of the body, and flat pad contact means adjacent the junction between said funnel flange and said body for forming a heat transmitting contact with printed circuitry on the circuit board.

2. A circuit board solder eyelet as in claim 1 wherein said pad contact means comprises a flat annular portion of said flange joining said body and extending radially outwardly therefrom.

3. A circuit board solder eyelet as in claim 2 including a notch formed in said funnel flange extending into said portion.

4. A circuit board solder eyelet as in claim 2 including a cylindrical insulation sheath fitted around said body and wherein said portion extends radially outwardly past said sheath, and said flange or means for forming a flange projects from the other end of said sheath.

5. A circuit board solder eyelet as in claim 4 including wire grip fingers extending into the interior of said body and openings in said body communicating the interior of the body with the inside surface of said sheath.

6. A circuit board solder eyelet as in claim 5 including a notch formed in the edge of said funnel flange and extending into said portions a distance insufficient to expose the end of said sheath.

7. A circuit board solder eyelet as in claim 1 including a cylindrical insulation sheath fitted around said body and extending between said funnel flange and said flange or means for forming a flange, said pad contact means extending radially outwardly of said body past said sheath.

8. A circuit board solder eyelet as in claim 1 including wire grip means in the interior of said body.

9. A circuit board solder eyelet as in claim 1 wherein a solder flow notch is formed in said flange, said notch extending into said pad contact means.

10. A circuit board solder eyelet including a cylindrical body, a generally funnel shaped circumfrential flange at each end of the body, one flange including a flat annular heat transmitting pad surface on the side thereof adjacent an outside end of the body, said surface lying in plane perpendicular to the axis of said body.

11. A circuit board solder eyelet as in claim 10 wherein a solder flow notch is formed in said flange, said notch extending into said surface.

12. A circuit board solder eyelet as in claim 10 including wire grip means in the interior of said body.

13. A circuit board solder eyelet as in claim 10 including a cylindrical insulation sheath fitted around said body and extending between said pad surface and the other flange.

14. A circuit board solder eyelet as in claim 13 wherein said pad surface extends radially outwardly past said sheath.

15. A circuit board contact system including a circuit board having sides formed of insulating material and a core of metal, an eyelet hole formed through the thickness of the circuit board, printed circuitry on one side of the circuit board for interconnecting circuit elements on the board, the circuitry including a printed circuit pad surrounding one end of said hole, a circuit board eyelet fitted in the circuit board hole, said eyelet including a cylindrical body portion, a sheath of insulating material fitted around said body portion, a funnel flange at each end of said body engaging the sides of the circuit board so as to confine the eyelet within the hole, the flange adjacent said pad including a flat annular heat transmitting contact surface extending radially outwardly past said sheath and lying flush upon the pad for transmitting heat from the eyelet to the pad during soldering, and a mass of solder within the interior of the eyelet body and extending therefrom past the contact surface and to the pad for establishing an electrical connection between the eyelet and the pad.

16. A circuit board contact system as in claim 15 wherein each flange includes a generally conical portion extending away from the circuit board and the flange adjacent said pad includes a solder flow notch extending from the edge thereof a distance insufficient to expose said sheath.

* * * * *